(12) United States Patent
Coteus et al.

(10) Patent No.: US 6,202,110 B1
(45) Date of Patent: Mar. 13, 2001

(54) MEMORY CARDS WITH SYMMETRICAL PINOUT FOR BACK-TO-BACK MOUNTING IN COMPUTER SYSTEM

(75) Inventors: Paul William Coteus, Yorktown Heights, NY (US); Robert Dominick Mirabella, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/829,020

(22) Filed: Mar. 31, 1997

(51) Int. Cl.$^7$ ............................................ G06F 13/40
(52) U.S. Cl. .................... 710/102; 361/684; 361/788
(58) Field of Search ................. 395/282; 711/5; 361/684, 760, 772, 788; 710/102, 101, 103

(56) References Cited

U.S. PATENT DOCUMENTS

| | | | | |
|---|---|---|---|---|
| 5,119,486 | * | 6/1992 | Albonesi | 711/172 |
| 5,463,755 | * | 10/1995 | Dumarot et al. | 395/287 |
| 5,754,796 | * | 5/1998 | Wang et al. | 395/281 |
| 5,926,378 | * | 7/1999 | DeWitt et al. | 361/788 |
| 6,058,442 | * | 5/2000 | Fort | 710/100 |

\* cited by examiner

*Primary Examiner*—Glenn A. Auve
(74) *Attorney, Agent, or Firm*—Volel Emile; Felsman, Bradley, Vaden, Gunter & Dillon, LLP

(57) ABSTRACT

Memory cards for a computer system are placed back-to-back on an active backplane, using wiring topology where the memory address and data busses are wired to pairs of symmetrical connectors. This topology takes advantage of symmetrical memory card pinouts to improve memory bus performance while reducing backplane cost and wiring complexity. The symmetrical layout of the data and address wiring allows two memory cards to be placed back-to-back on the backplane, maintaining the same relative position of data and address pins between cards. Since the data and most of the address lines are common to each card, and any such data or (common or non-unique) address pin on one card can be wired to any other such data or address pin, respectively, on the other card, the back-to-back arrangement provides for minimal address and data bus interconnect lengths between connectors. Each data signal can be wired from a memory controller data pin on the first connector, then daisy-chained through the short printed circuit card wire to an adjacent pin on the second connector. Likewise, non-unique address pins can be connected from the memory controller to such address pins that are parallel between connectors. Those unique address and control signals which are to be connected together are placed as close as possible to the centerpoint of the edge connector.

16 Claims, 6 Drawing Sheets

MEMORY CARDS WITH SYMMETRICAL PINOUT FOR BACK-TO-BACK MOUNTING IN COMPUTER SYSTEM

BACKGROUND OF THE INVENTION

This invention relates to computer memory construction, and more particularly to memory cards arranged to be mounted back-to-back on a backplane board.

Computer systems are designed to meet an ever-increasing demand to operate memory and processor busses at higher and higher frequencies. One feature which is used to meet these requirements is the use of an active backplane, i.e., circuitry which functions as both memory control and as a bridge between the CPU bus and the I/O bus is mounted directly on the backplane or motherboard. This circuitry buffers and routes data between various devices on the processor and I/O busses as well as maintains the coherency of cacheable data. Because this memory controller and bridge circuitry communicates with processor, memory and I/O subsystems, it resides on the backplane, centered between the main busses (processor bus, memory bus, I/O bus) to minimize the lengths of interconnect wires. The CPU is mounted on a daughter card, and the memory devices (SIMMs or DIMMs) are also mounted on daughter cards. These daughter cards are mounted at right angles to the backplane or motherboard, in connector slots.

To accommodate additional memory, a backplane is usually designed to support multiple memory cards. For example, there may be two slots for mounting two memory cards, in a typical construction, and these two memory cards are mounted in a front-to-back arrangement, i.e., both facing the same way. When laying out the backplane with this type of memory card, sufficient separation must be maintained between edge connectors for the cards to accommodate clearance required for the SIMMs or DIMMs which extend at right angles from the memory cards. This separation distance between memory cards adds to the overall length of the path for each memory data, address and control signal between the memory controller and the memory cards. The increased path length contributes to the RC wire delay, which increases the memory bus cycle time, degrading overall memory bandwidth and system performance. In one example of a typical contemporary construction, using connectors made by AMP called High Speed Card Edge Connectors (HSCE), with 200-pin SDRAMs Memory DIMMs (JEDEC standard number 21-C of JC42.5), and nominal memory card thickness of 0.070 inch, allowing 0.170 inch for card sway, yields a card separation of 1.50 inches. With typical propagation delays of printed circuit card wires at 180 picoseconds per inch, the 1.50 inches of card wire contributes at least 270 picoseconds of delay to each memory net.

SUMMARY OF THE INVENTION

It is therefore one object of the present invention to provide an improved computer construction.

It is another object of the present invention to provide an improved memory card arrangement to reduce memory access time in a computer.

It is a further object of the present invention to provide an improved method of mounting memory cards in a computer system to reduce the spacing between cards and reduce the overall size of the system.

The above as well as additional objects, features, and advantages of the present invention will become apparent in the following detailed written description.

According to one embodiment of the invention, memory cards for a computer system can be placed back-to-back on an active backplane, using wiring topology where the memory address and data busses are wired to pairs of symmetrical connectors. This topology takes advantage of symmetrical memory card pinouts to improve memory bus performance while reducing backplane cost and wiring complexity. The symmetrical layout of the data and address wiring allows two memory cards to be placed back-to-back on the backplane, maintaining the same relative position of data and address pins between cards. Since the data and most of the address buses are common to each card, and any such data or address pin (that is common or non-unique) on one card can be wired to any other such data or address pin, respectively, on the other card, the back-to-back arrangement provides for minimal address and data bus interconnect lengths between connectors. Each data signal can be wired from a memory controller data pin on the first connector, then daisy-chained through the short printed circuit card wire to an adjacent pin on the second connector. Likewise, non-unique address pins can be connected from the memory controller to address pins that are parallel between connectors. Those unique address and control signals which are to be connected together are placed as close as possible to the centerpoint of the edge connector. In the example given above, the memory connector pitch can be reduced to 0.50 inch, compared to 1.50 inch in the prior construction. Signal propagation delay is reduced by a factor of three from the conventional front-to-back orientation. Backplane wiring complexity and cost are also reduced. The short, parallel daisy-chained interconnects between connector pins reduce the need for many board wiring layers for interconnecting the data and address busses. The reduced layer count, along with the board area savings resulting from placing the two connector slots as close as possible, serve to reduce the raw card component cost.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION

Figure 1:
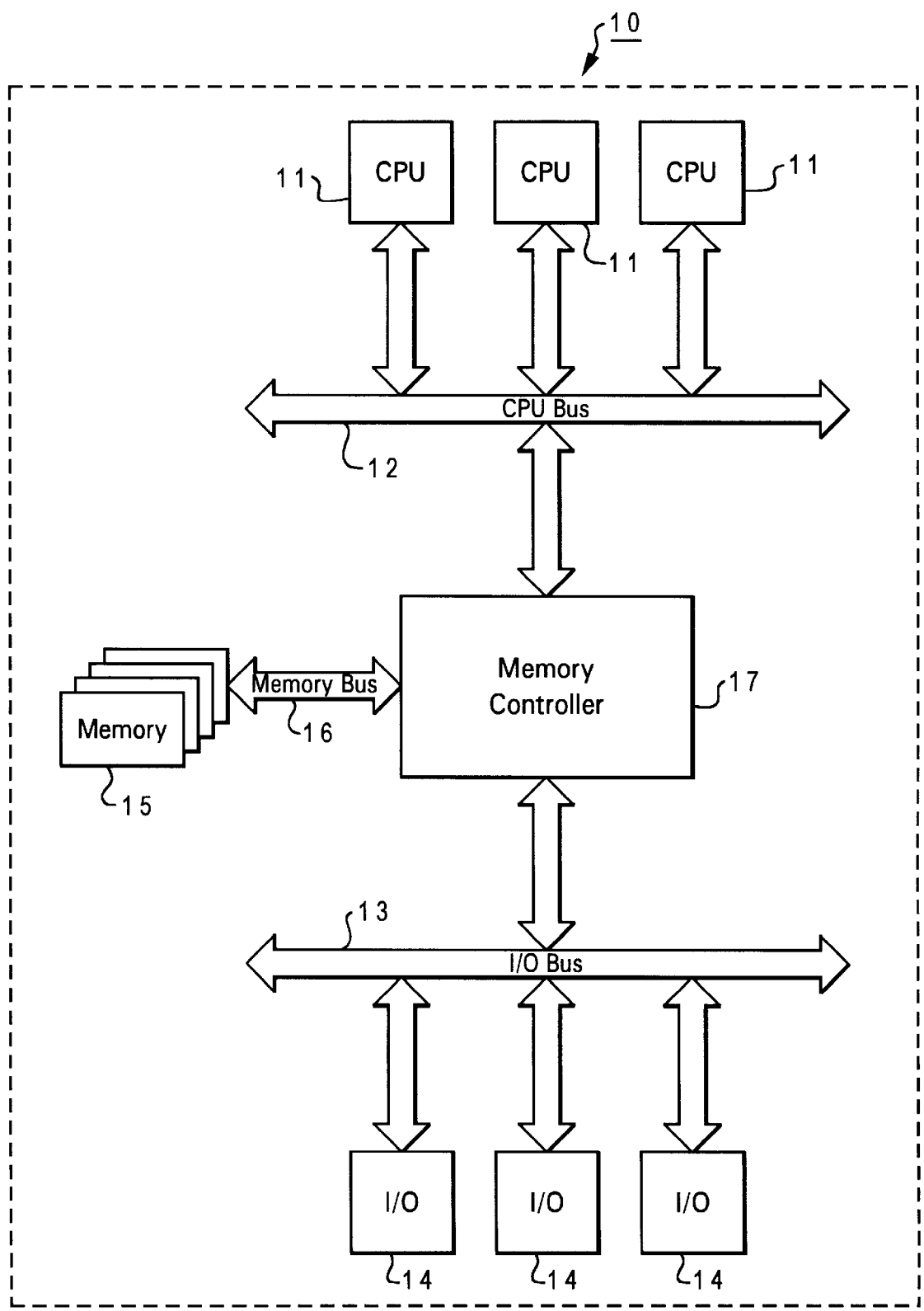
FIG. 1 is an electrical diagram in block form of a computer system constructed using features of one embodiment of the present invention.

Referring to FIG. 1, a central electronic complex for a computer system 10 is shown which may employ an active back-plane and the back-to-back memory card arrangement of the invention. This system 10 employs three processors 11 in this example, and the processors are connected to a CPU bus 12. An I/O bus 13, such as a PCI bus, is used to make connection to a number of I/O deices 14 which usually include disk storage, CD-ROM drive, tape drives, network adapters, console, etc. Main memory for the system is provided by a number of memory cards 15 which are coupled to the system by a memory bus 16 and a memory controller 17. The memory controller 17 also functions as a bridge between the CPU bus 12 and the expansion or I/O bus 13. As will be explained, the memory cards are configured in a symmetrical manner which allows them to be mounted in a back-to-back arrangement, saving space in the housing and reducing the propagation delays in the wiring needed to make connection from the cards to the remainder of the system.

Figure 2:
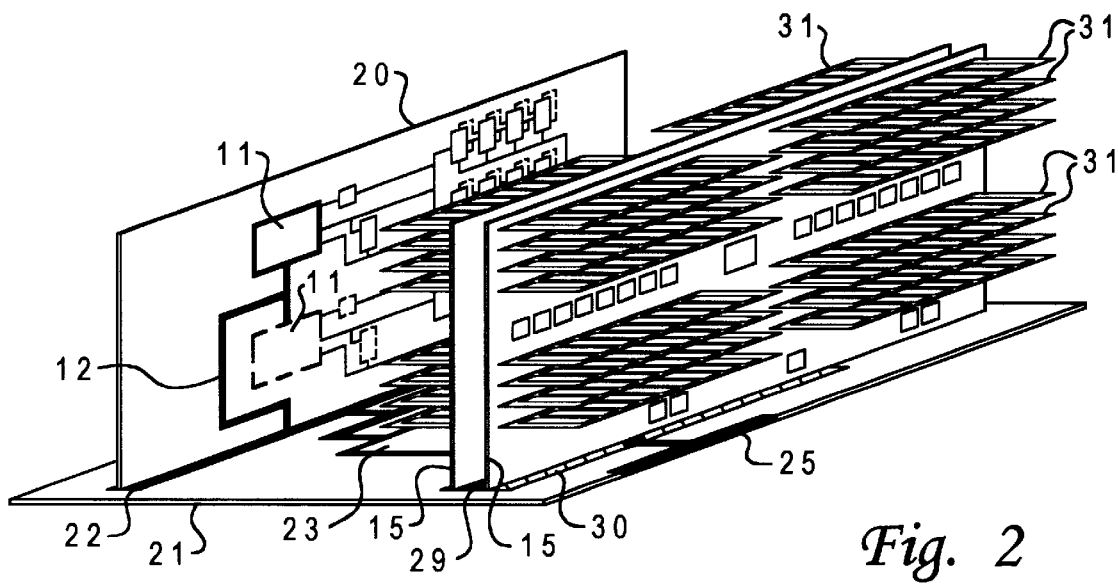
FIG. 2 is a pictorial view of the central electronics assembly of the system of FIG. 1, showing the backplane, CPU card and memory cards.

Referring to FIG. 2, the physical construction of the system 10 is illustrated, inside a main system housing. The processors 11 are microprocessor chips mounted on a CPU card 20, and this card 20 is a daughter card mounted on a backplane or motherboard 21 by an edge connector 22. The layout of the backplane card 21 is seen also in FIG. 3. The memory controller 17 is made up of circuitry mounted on the backplane card 21 and mostly consists of two ASICs or application-specific integrated circuits 23 and 24, one for data and one for control, although the particular construction of this memory control circuitry is not a part of the invention. This type of construction is of the active backplane type, in that the memory controller or bridge circuitry 17 is mounted directly on the backplane card 21 rather than on a separate daughter card or on the CPU board or memory boards. The CPU bus 12 consists of the conductors on a connector socket 22. A connector 25 is used to connect the I/O bus to I/O devices as is the usual construction.

Figure 3:
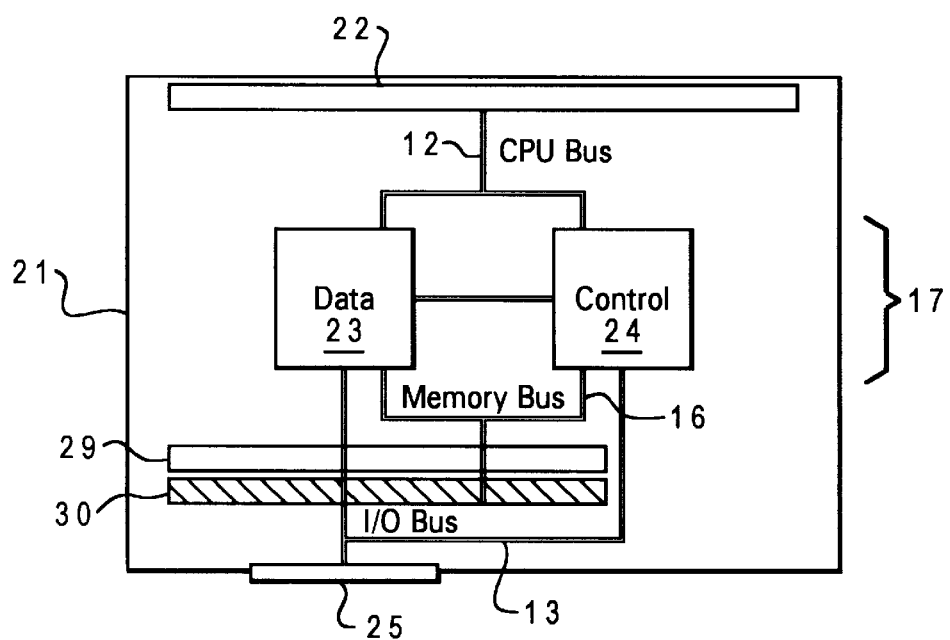
FIG. 3 is a plan view of the backplane or motherboard in the system of FIGS. 1 and 2.

According to the invention, the memory cards 15 are daughter boards mounted back-to-back using a pair of edge connectors 27 and 28 fitting into a pair of connector sockets 29 and 30 as seen in FIGS. 2 and 3. A number of SIMM (Single In-line Memory Module) or DIMM (Dual In-line Memory Module) devices 31 are mounted on the memory cards 15 at an angle, e.g., 90°. Each SIMM or DIMM contains SDRAMs using standard pin-outs. The arrangement of one of the memory cards 15 is seen in more detail in FIG. 4, in one example. Sixteen DIMMs 31 are inserted into sixteen edge connectors 33 in four banks of four each. All data lines 34 for two banks on the right are connected to data pins 35 on one side of the edge connector 27, and all data lines 36 for two banks on the left are connected to data pins 37 on the other side of the edge connector 27. All of the address/control lines for the memory chips are connected by centrally-located lines 38 to pins 39 in a central part of the edge connector. The lines 34, 36 and 38 are bus wires, show schematically (not actual physical layout) in a multilayer printed circuit board. An important feature is that the memory boards 15 and the pins 35, 37 and 39 are symmetrical, so the card may be reversed from left to right and function in an identical manner. Note that some of the address lines, and the control lines of the bus, are not interchangeable with similar lines on the opposite end of the edge connector 27. That is, the data lines are interchangeable in that line D03 might just as well be called line D60, for example, after the memory card is in place, and so it is immaterial that the pins 35 engage one or the other of the sets of data lines for the slot 29, i.e., the memory cards can be inserted facing either way; the same is true for most of the address lines. However, some address lines and all of the control lines may not be treated this way, and, therefore, some of the central lines 38 are orientation-dependent, and this is taken into account in the edge connectors 29 and 30 as explained below.

Figure 5:
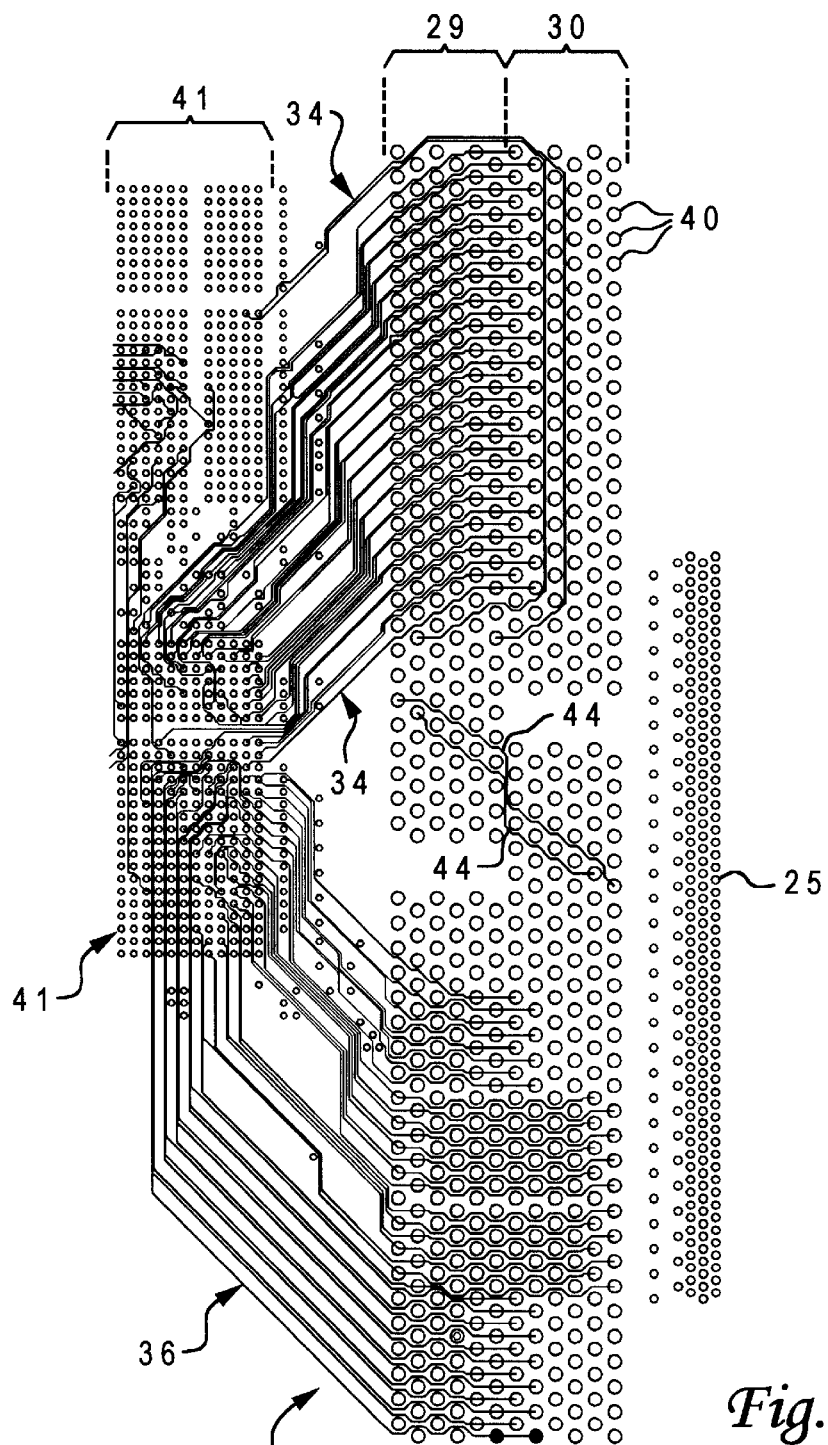
FIG. 5 is a detail view of part of the wiring on the printed circuit board used to construct the backplane board of FIGS. 2 and 3.
Figure 5:
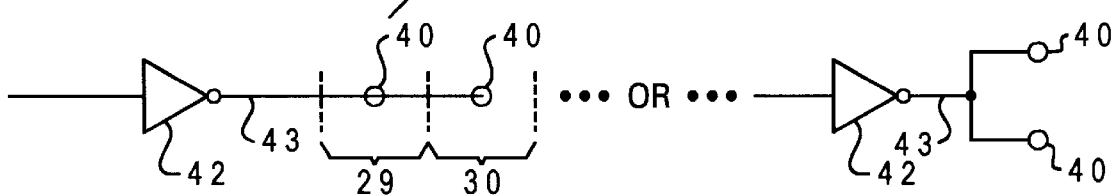

Referring to FIG. 5, an example of the actual routing of memory data bus conductors on a backplane 21 is illustrated. This Figure is an illustration of only one level of wiring in construction of a PC board for the backplane card 21, the one level being that corresponding to the data lines 34 and 36 (of the memory boards) to engage the tabs 35 and 37 of the edge connector to be placed in the connector sockets 29 and 30. Two vertical groups of circles 40 make up the connector pads for edge connectors 29 and 30. Each circle 40 represents a contact point for the edge connector. The edge connector 29 for one memory card 15 is mounted so that pins of the edge connector engage through-hole vias (connector pads) 40 in one group, and likewise the other edge connector 30 for the second memory card 15 is mounted so that pins of the edge connector engage through-hole vias (circles) 40 in a second (identical) group. The data lines 34 and 36 are seen as conductor lines on one level of the PC board running from a group of connector pads 41 for the data ASIC 23 of the memory controller 17. Memory address and control lines 38 are not shown; these would be on another level of the PC board. It is important to note that each of the wires in the data busses 34 and 36 is connected to a circle 40 in one of the groups for connector slot 29 and also to a circle 40 in one of the groups for connector slot 30 in a serial or daisy-chain fashion as illustrated in the view at the lower left; an output of a buffer/inverter 42 in the memory controller data chip 23 is connected by a wire 43 (one of the data lines 36) to a circle 40 in the for the edge connector 29 for one memory board 15 and also directly to a circle 40 for the edge connector 30 for the other memory board 15. Although the daisy-chain arrangement is shown in the board 21 layout of FIG. 5, a T or branch connection could be used as seen in the lower right of the Figure. In the central part of the rows of pads 40 for the connectors 29 and 30, lines 44 connecting pairs of pads 40 show the treatment for unique address lines or control lines; connections to these pads from the connector 41 is not seen in this Figure as these are on another PC board level. A line 44 connects two pads 40, one for slot 29 and the other for slot 30, which are as close to the central area as possible, so the central part 39 of the edge connector 27 for the memory card will have a tab which connects to one pad 40 if the memory card is facing one way, or to the other pad 40 if the memory card is facing the other way.

Figure 6:
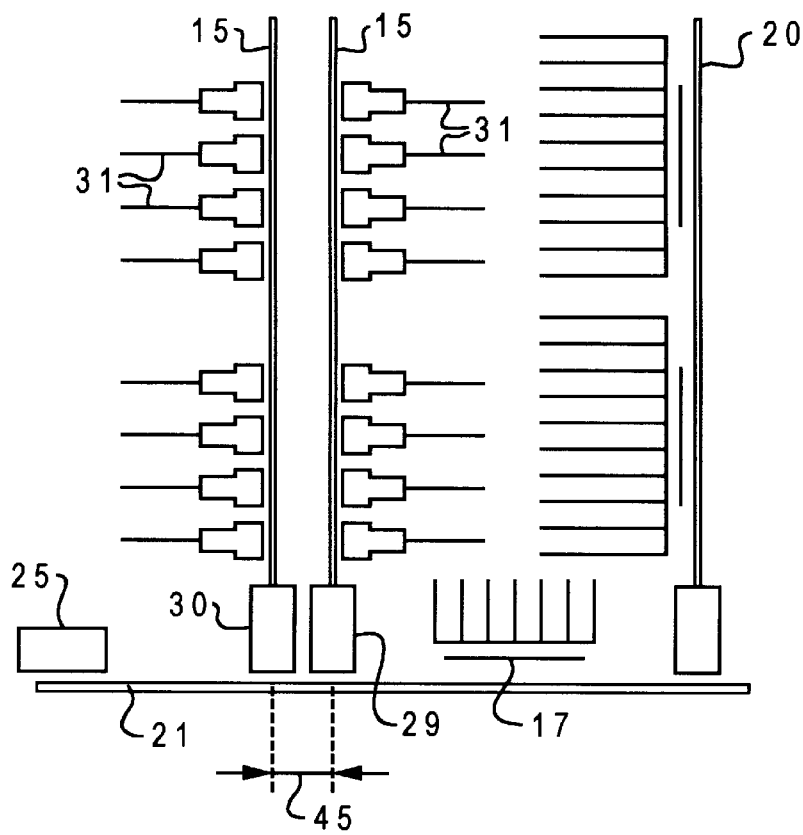
FIG. 6 is an elevation view of the board configuration in the system of FIGS. 1–5.
Figure 7:
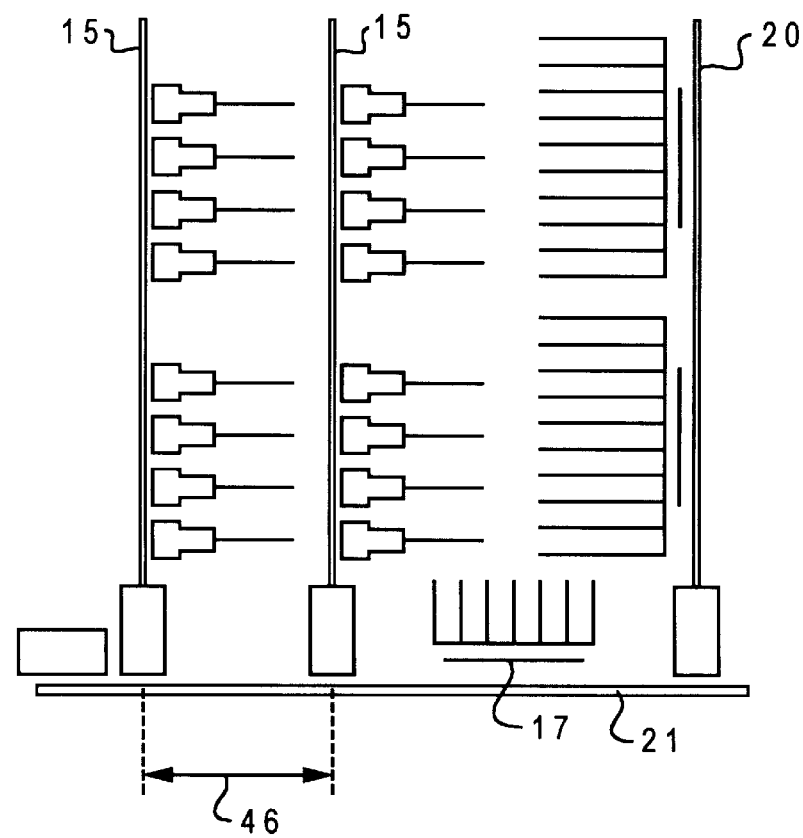
FIG. 7 is an elevation view of a board configuration for a conventional way of orienting the memory boards in a computer system.

Referring to FIG. 6, the motherboard 21 and the daughter boards 15 and 20 are shown to illustrate the improved spacing. The back-to-back arrangement of the two memory boards 15 allows the spacing between centerlines of the two edge connectors 29 and 30 (and thus the two memory boards 15) to be about 0.5 inch, using the example of HSCE connectors as given above. The is in contrast to the conventional arrangement illustrated in FIG. 7, where the memory boards 15 are facing in the same direction; here the spacing 46 between the memory cards 15 is about 1.50 inch, and so the path for data and control signals from the CPU through the memory controller 17 to and from the main memory is increased by that amount compared to the embodiment of FIG. 6.

Figure 4:
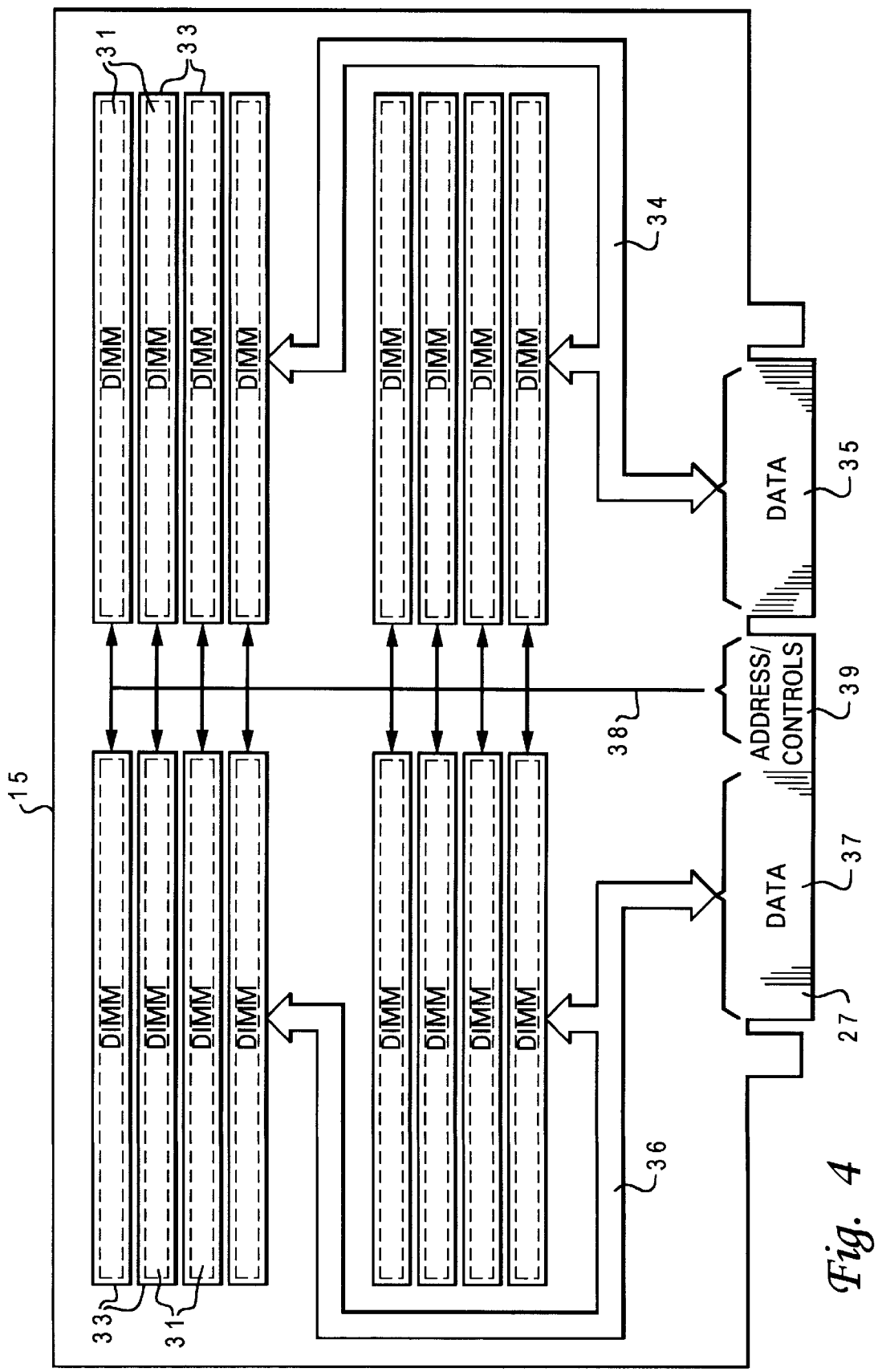
FIG. 4 is a plan view of one of the memory cards used in the system of FIGS. 1 and 2.
Figure 8:
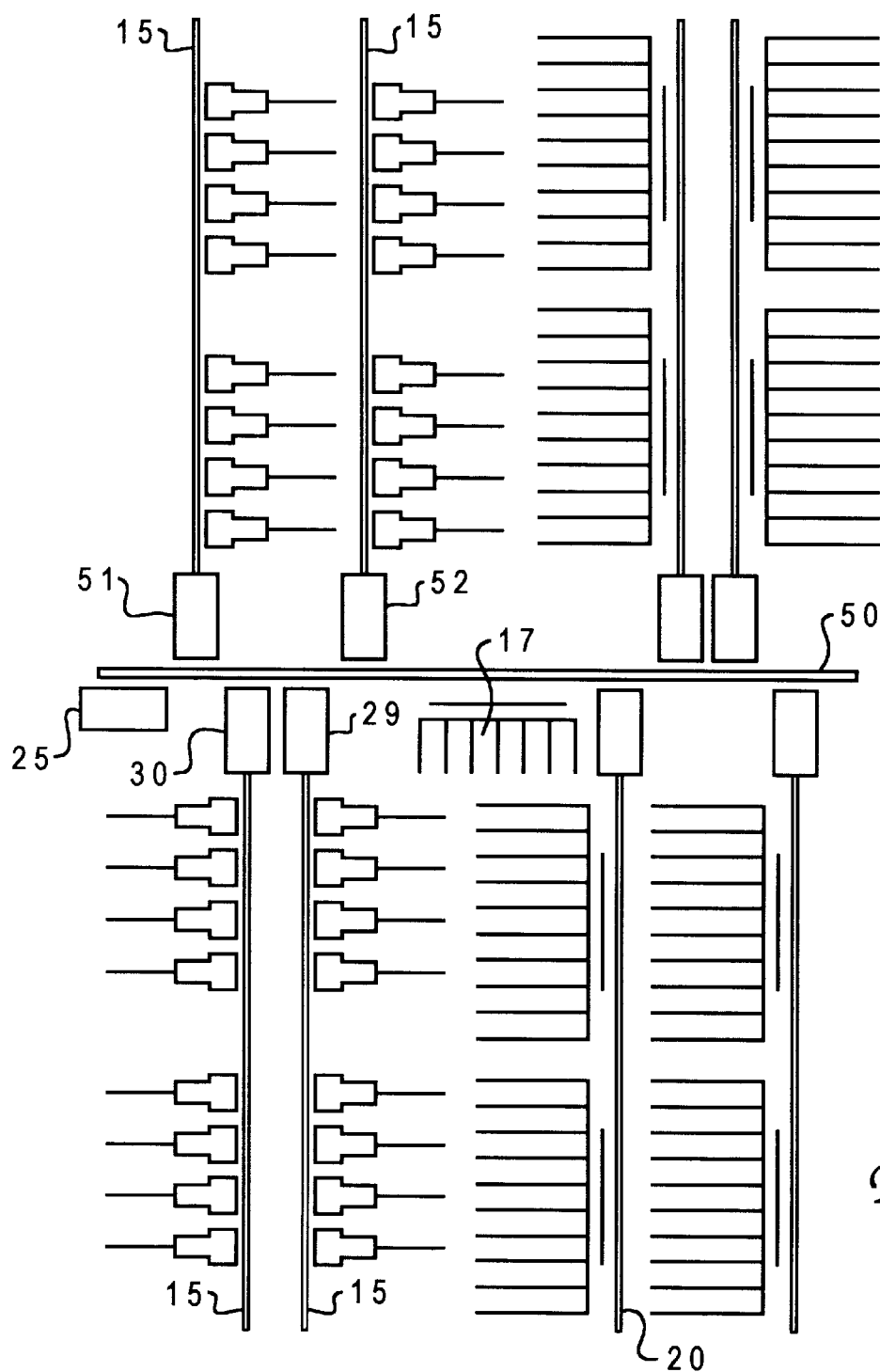
FIG. 8 is an elevation view like FIG. 6 for a board configuration employing a double-sided backplane according to another embodiment of the invention.
Figure 9:
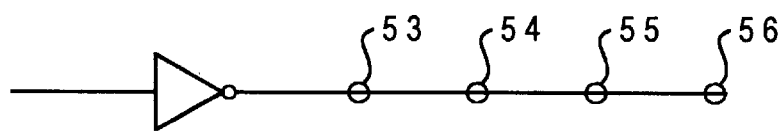
FIG. 9 is an electrical diagram of the daisy-chain wiring connection to pins of the memory boards of FIG. 8 for one data or address line.

In another embodiment, illustrated in FIG. 8, the features of the invention are extended beyond a two-card memory system. A four memory card system employs an active backplane or motherboard 50 which is double-sided. Two of the four memory cards 15 are coupled to the lower side of the backplane in a back-to-back manner using two connector slots 29 and 30 just as in FIG. 6. The other two memory cards 15 are mounted on the upper side using connector slots 51 and 52 for conventional front-to-back orientation (as in FIG. 7). The memory cards 15 are all constructed as seen in FIGS. 4 and 5, however, so connections can be wired in the daisy-chain form as before. That is, referring to FIG. 9, a single input/output line from the memory controller 17 would be wired to four connector pads 53–56 in series, one for each of the connector slots 29, 30, 51, and 52, respectively. Thus, the shorter routing of data and address/control signals is still obtained. Since the space for the two connector slots 29 and 30 is needed on the backplane between the areas for slots 51 and 52, there is no need to place these slots 51 and 52 in back-to-back orientation, but the advantages are still present because the two lower boards 15 in slots 29 and 30 are in back-to-back relationship.

While the invention has been shown and described with reference to a specific embodiment, it will be understood by those skilled in the art that various changes may be made in form and detail of the illustrated embodiment, and other embodiments may be appear, without departing from the true spirit and scope of the invention.

What is claimed is:

1. A computer system comprising:
   a backplane having a pair of parallel card slots;
   a pair of memory cards mounted in said pair of parallel card slots comprising:
      a first memory card having a plurality of memory devices mounted on a first side thereof, a plurality of symmetrical data connections and a plurality of central connections arranged to be inserted into a card slot in a first orientation; and
      a second memory card having a plurality of memory devices mounted on a second side thereof, a plurality of symmetrical data connections and a plurality of central connections arranged to be inserted into a card slot in a second orientation;
   such that said first memory card and second memory card may be mounted back-to-back reducing prorogation delay and backplane wiring complexity.

2. A computer system according to claim 1 wherein at least one CPU is mounted on said backplane via a daughter card.

3. A computer system according to claim 1 wherein memory control circuitry is mounted directly on said backplane.

4. A computer system according to claim 1 wherein said memory devices are SIMMs or DIMMS.

5. A computer system according to claim 1 wherein each memory card has a connector for insertion in one of said card slots, said connector having a central area for address and control lines and having symmetrical outer areas for data lines.

6. A computer system according to claim 5 wherein wiring for each of said data lines is connected serially from a pin for one of said pair of memory cards to a pin for a corresponding data line for the other of said pair of memory cards.

7. A computer system according to claim 6 wherein memory control circuitry is mounted directly on said backplane for connection to said address and control lines and said data lines.

8. A computer system according to claim 6 wherein said memory devices are modules extending a given amount from said pair of memory cards in opposite directions, and said pair of memory cards is spaced on said backplane by less than said given amount.

9. A digital system comprising:
   a board having a pair of parallel connector slots;
   a pair of component cards mounted in said pair of parallel connector slots comprising:
      a first component card having a plurality of devices mounted on a first side thereof, a plurality of symmetrical data connections and a plurality of central connections arranged to be inserted into a connector slot in a first orientation; and
      a second component card having a plurality of devices mounted on a second side thereof, a plurality of symmetrical data connections and a plurality of central connections arranged to be inserted into a connector slot in a second orientation;
   such that said first component card and said second component card may be inserted back-to-back.

10. A digital system according to claim 9 wherein said devices are memory devices in in-line modules.

11. A digital system according to claim 9 wherein said board has memory controller circuitry mounted thereon, and wherein at least one processor is mounted on said board via a daughter card.

12. A digital system according to claim 9 wherein said each component card has a connector for insertion in one of said slots, said connector having a central area for address and control lines and having symmetrical outer areas for data lines, said pair of component cards being mounted back-to-back.

13. A digital system according to claim 12 wherein wiring for each of said data lines is connected serially from a pin for one of said pair of component cards to a pin for a corresponding data line for the other of said pair of component cards.

14. A digital system according to claim 13 wherein control circuitry is mounted directly on said board for connection to said address and control lines and said data lines, and wherein at least one CPU is mounted on said board via a daughter card.

15. A digital system according to claim 14 wherein said devices are modules extending a given amount from said pair of component cards in opposite directions, and said pair of component cards is spaced on said backplane by less than said given amount.

16. A digital system according to claim 9 wherein said component cards comprise main memory in a computer system having a CPU mounted on said board.

* * * * *